United States Patent [19]
Watanabe et al.

[11] Patent Number: 5,656,841
[45] Date of Patent: Aug. 12, 1997

[54] SEMICONDUCTOR DEVICE WITH CONTACT HOLE

[75] Inventors: Hirofumi Watanabe, Miki; Kaihei Isshiki, Nishiwaki; Tetsurou Tanigawa, Takasago; Yasuyuki Shindou, Kakogawa; Katsunari Hanaoka, Ono, all of Japan

[73] Assignee: Ricoh Company, Ltd., Tokyo, Japan

[21] Appl. No.: 545,398

[22] Filed: Oct. 19, 1995

[30] Foreign Application Priority Data

Oct. 28, 1994 [JP] Japan .................. 6-288844

[51] Int. Cl.⁶ .................................. H01L 27/11
[52] U.S. Cl. .................. 257/318; 257/382; 257/412; 257/754; 257/758; 257/903
[58] Field of Search .................. 257/318, 326, 257/412, 413, 773, 774, 776, 903, 758, 754, 755, 382, 401

[56] References Cited

U.S. PATENT DOCUMENTS

| | | | |
|---|---|---|---|
| 3,577,036 | 5/1971 | Curtis et al. | 257/774 X |
| 4,541,893 | 9/1985 | Knight | 156/643 |
| 4,728,627 | 3/1988 | Mase et al. | 437/190 |
| 4,891,094 | 1/1990 | Waldo, III | 156/626 |
| 4,924,295 | 5/1990 | Küecher | 357/71 |
| 4,962,060 | 10/1990 | Sliwa et al. | 437/192 |
| 5,063,175 | 11/1991 | Broadbent | 257/774 X |
| 5,443,941 | 8/1995 | Bariya et al. | 430/313 |
| 5,451,819 | 9/1995 | Koyama | 257/774 X |
| 5,471,091 | 11/1995 | Pasch et al. | 257/774 X |

FOREIGN PATENT DOCUMENTS

| | | | |
|---|---|---|---|
| 60-173857 | 9/1985 | Japan | H01L 21/88 |
| 4-17329 | 1/1992 | Japan | H01L 21/285 |
| 4-10219 | 2/1992 | Japan | H01L 21/285 |
| 4218945 | 8/1992 | Japan | 257/774 |

*Primary Examiner*—William Mintel
*Attorney, Agent, or Firm*—Cooper & Dunham LLP

[57] ABSTRACT

In a manufacturing method of a semiconductor device, a gate insulating film is grown in an active region. Thereafter, an N-type polysilicon film is formed on the gate insulating film and is patterned so that a gate electrode and a polysilicon electrode are formed. Next, arsenic ions are implanted onto entire faces of the gate and polysilicon electrodes so that a source-drain region is formed on a substrate. An interlayer insulating film is then formed on an entire face of the source-drain region, etc. Thereafter, a contact hole is formed on a drain region in a position in which the drain region partially overlaps the polysilicon electrode. A surface portion of the polysilicon electrode is exposed into the contact hole. Thereafter, phosphoric ions are implanted through the contact hole with the interlayer insulating film as a mask. The implanted ions are thermally processed to activate these implanted ions. Thereafter, metal wiring is formed. Thus, resistance of a common contact having s three-dimensional structure is reduced.

2 Claims, 7 Drawing Sheets

SEMICONDUCTOR DEVICE WITH CONTACT HOLE

BACKGROUND OF THE INVENTION

1. Field of the Invention

The present invention relates to a MOS semiconductor device and a manufacturing method thereof. More particularly, the present invention relates to a MOS semiconductor device and a manufacturing method thereof characterized in contact with metal wiring.

2. Description of the Related Art

The gate length of a MOS transistor and the diameter of a contact hole are reduced as semiconductor integrated circuit device (LSI) are highly integrated. For example, when one LSI device is manufactured by a finer generation rule, the semiconductor device has been integrated by reducing an entire size thereof approximately in the same ratio with the same basic layout. There is no problem if all generation rules are reduced (linearly shrunk) in the same ratio in this way. However, all the generation rules cannot be linearly shrunk necessarily. As a result, manufacturing processes of the semiconductor device cannot be improved since no area for the semiconductor device can be sufficiently reduced.

Figure 1:
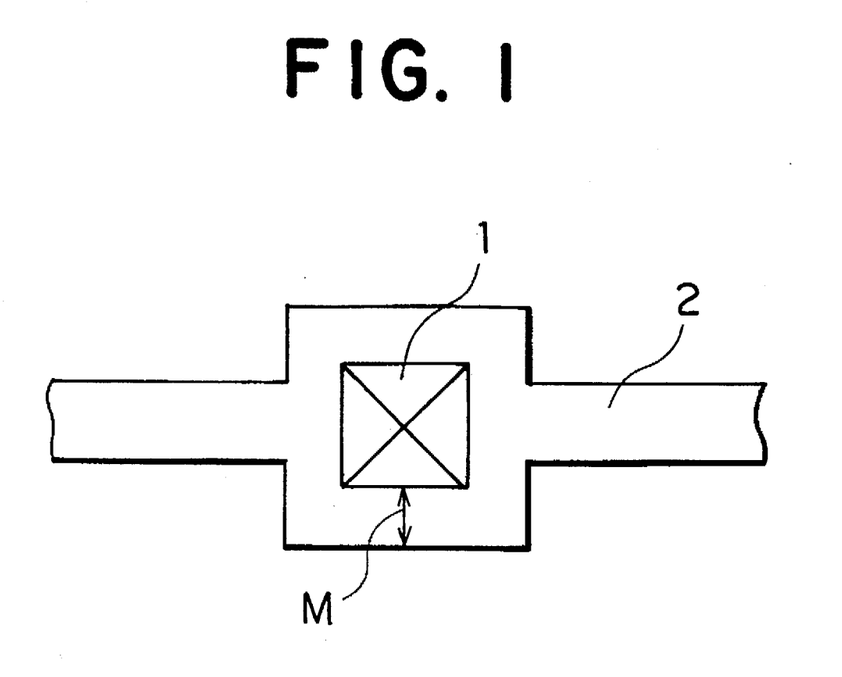
FIG. 1 is a plan view showing a general contact.

When this problem is considered in relation to a contact hole, a diameter of the contact hole is very important as a generation rule. As shown in FIG. 1, overlapping margins M of fields and metal wiring around the contact hole 1 exist at any time. These margins cannot be reduced in the same ratio as the diameter of the contact hole so that high integration of the semiconductor device is prevented.

Figure 2A:
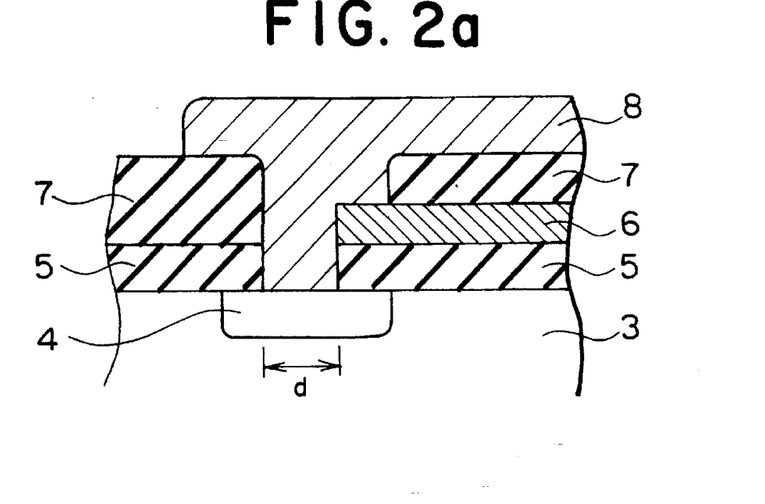
FIG. 2a is a cross-sectional view showing a contact considered as a common contact.

There is a so-called common contact technique for increasing an integration degree of contacts. With respect to this common contact technique, three contacts or more are connected to each other through one contact hole. FIG. 2a shows one example of this common contact. A diffusion region 4 of an N-type or a P-type having a high impurity concentration is formed on a substrate 3. A polysilicon electrode 6 and metal wiring 8 are connected to the diffusion region 4. In FIG. 2a, an insulating film 5 is formed between the substrate 3 and the polysilicon electrode 6. An insulating film 7 is formed between the polysilicon electrode 6 and the metal wiring 8.

Figure 2B:
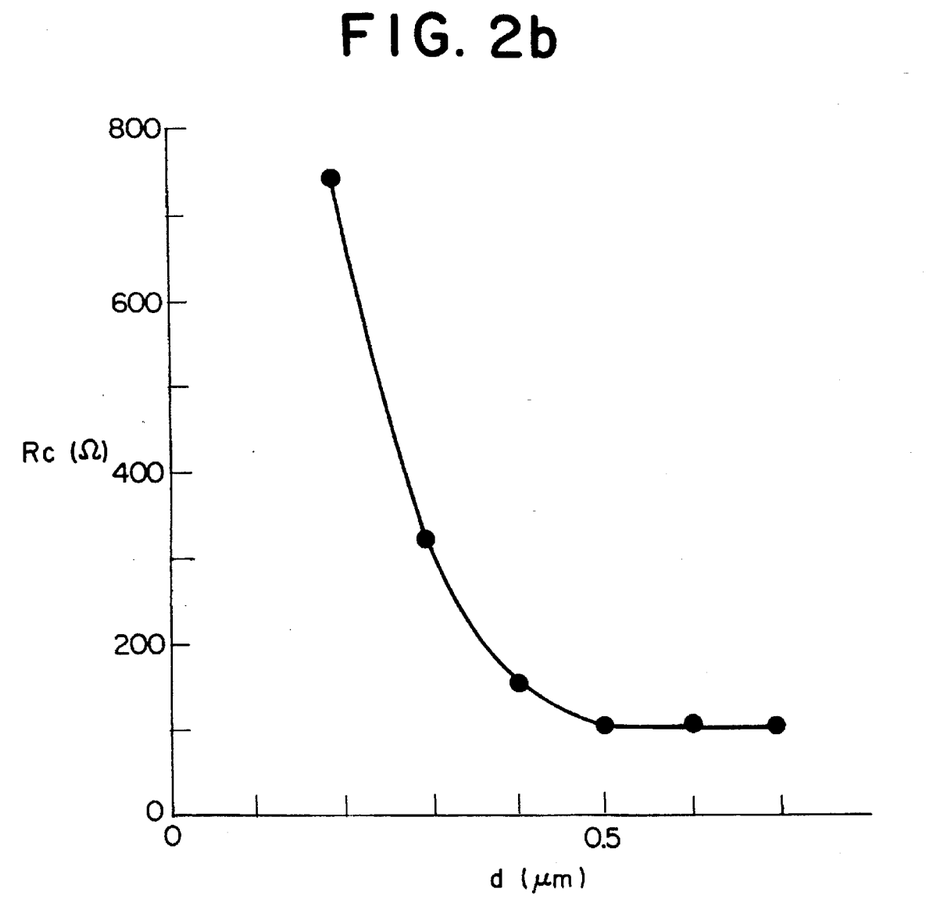
FIG. 2b is a graph showing resistance of the common contact in relation to the size of a bottom face of a contact hole.

When the common electrode is provided as in FIG. 2a, the diameter of a contact hole forming the common contact must be also reduced naturally in the same ratio as the other constructional portions in accordance with a generation rule. However, when three contacts or more are three-dimensionally connected to each other as in FIG. 2a, it is difficult to hold contact resistance to a sufficiently low level in comparison with normal contact resistance. When the size of a bottom face of the contact hole within the diffusion region 4 in FIG. 2a is set to d, contact resistance between the metal wiring 8 and the diffusion region 4 with respect to the size d is measured by a Kelvin method. FIG. 2b shows measured results of this contact resistance. As shown in FIG. 2b, when the size d is equal to or smaller than 0.4 µm, the contact resistance Rc is rapidly increased.

SUMMARY OF THE INVENTION

It is therefore an object of the present invention to provide a semiconductor device and a manufacturing method thereof for reducing the resistance of a common contact having a three-dimensional structure as shown in FIG. 2a.

In a semiconductor device of the present invention, a common contact is formed on a diffusion region through a first insulating film as a lower layer and a second insulating film as an upper layer formed on a semiconductor substrate. A polysilicon electrode is formed between the first and second insulating films and is exposed into a contact hole. Metallic wiring comes in contact with both the polysilicon electrode and the diffusion region through the contact hole. Impurities of the same conductivity type as the diffusion regions are implanted to exposure portions of the polysilicon electrode and the diffusion region exposed into the contact hole so that resistances of the polysilicon electrode and the diffusion region are reduced.

The semiconductor device having the common contact in the present invention has a memory cell including at least a pair of MOS transistors in which gate and drain electrodes of one MOS transistor are respectively connected to drain and gate electrodes of another MOS transistor. The diffusion region is a drain region of each of the MOS transistors and the polysilicon electrode is also used as the gate electrode.

A manufacturing method of the semiconductor device comprises the following processes (A) to (F) to form such a common contact:

(A) a process for forming local oxidation isolation structures on the surface of a semiconductor substrate of a first conductivity type, isolated active regions from each other, and forming a first insulating film as a gate insulating film on a surface of each of the active regions;

(B) a process for forming a polysilicon film on the first insulating film, patterning this polysilicon film as a gate electrode of one MOS transistor formed in each of the active regions, and forming a polysilicon electrode connected to a drain region of another MOS transistor;

(C) a process for implanting impurity ions of a second conductivity type to the semiconductor substrate with the polysilicon electrode as a mask so as to form a diffusion region for a source and a drain;

(D) a process for forming a second insulating film on the polysilicon electrode, forming a contact hole such that this contact hole reaches the diffusion region and a surface portion of the polysilicon electrode is exposed into this contact hole;

(E) a process for implanting impurity ions of the second conductivity type through this contact hole; and (F) a process for forming a metallic film on the second insulating film, and patterning this metallic film so as to form metal wiring connected to both the polysilicon electrode and the diffusion region through the contact hole.

In accordance with this semiconductor device, resistance of the common contact having a three-dimensional structure can be reduced.

Further objects and advantages of the present invention will be apparent from the following description of the preferred embodiments of the present invention as illustrated in the accompanying drawings.

DESCRIPTION OF THE PREFERRED EMBODIMENTS

The preferred embodiments of a semiconductor device and a manufacturing method thereof in the present invention will next be described in detail with reference to the accompanying drawings.

Embodiment 1

Figure 3A:
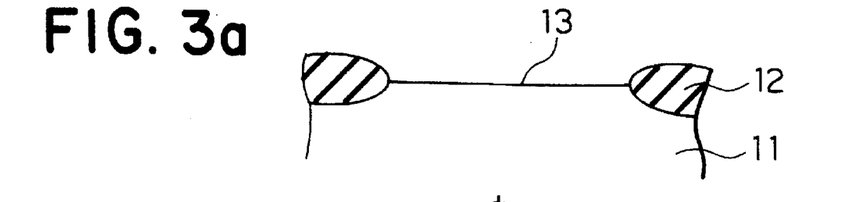
FIGS. 3a to 3e are cross-sectional views showing manufacturing processes in a manufacturing method of a semiconductor device in accordance with one embodiment of the present invention.
Figure 3B:
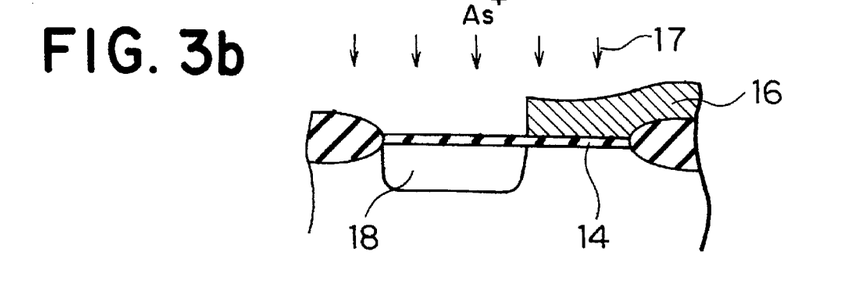
Figure 3C:
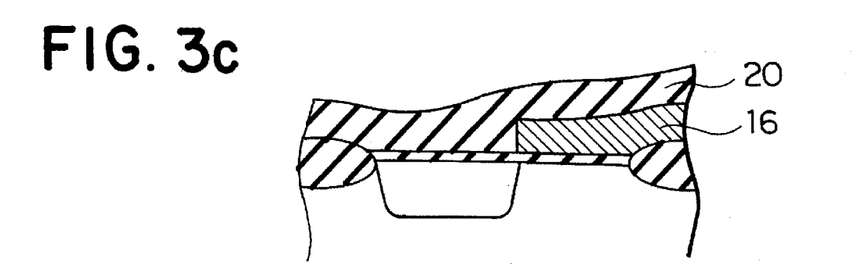
Figure 3D:
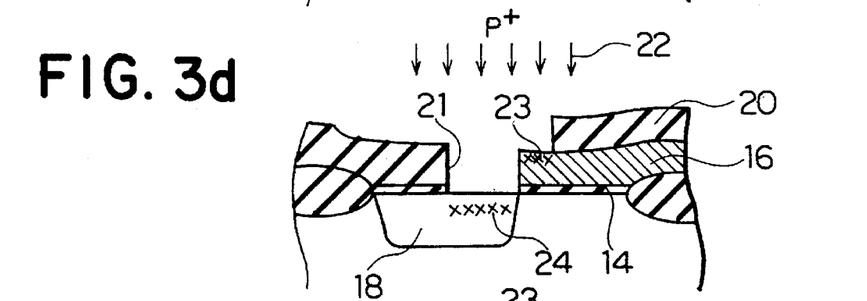
Figure 3E:
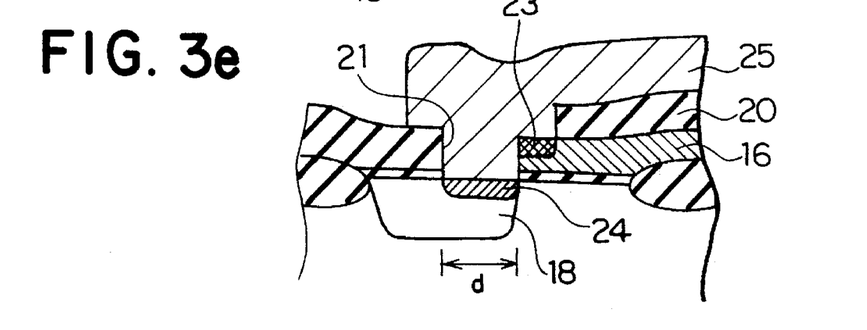
Figure 4A:
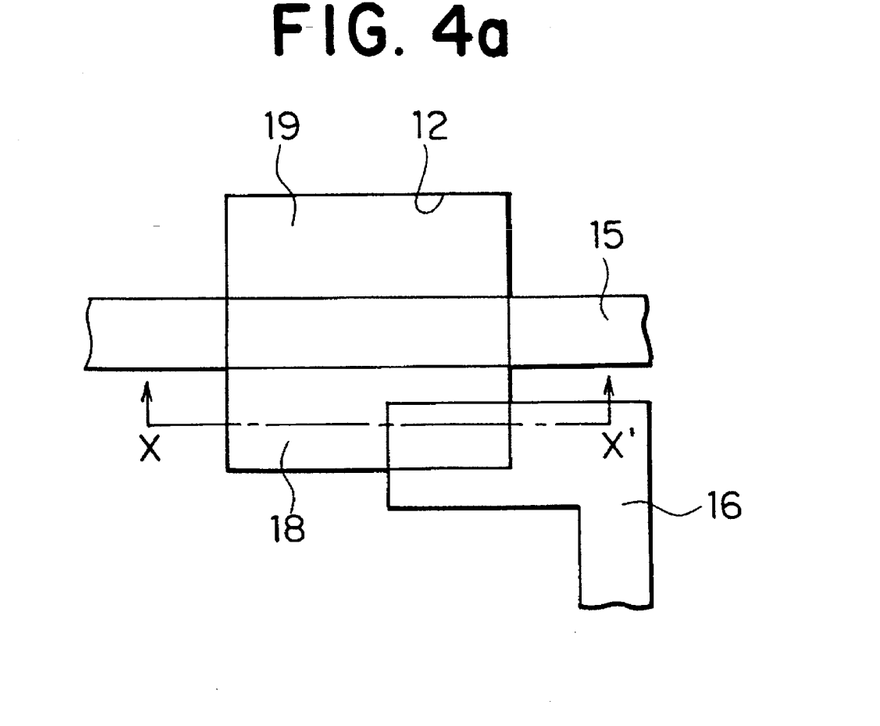
FIGS. 4a and 4b are plan views of the semiconductor device at stages of manufacturing processes of FIGS. 3b and 3d, respectively.
Figure 4B:
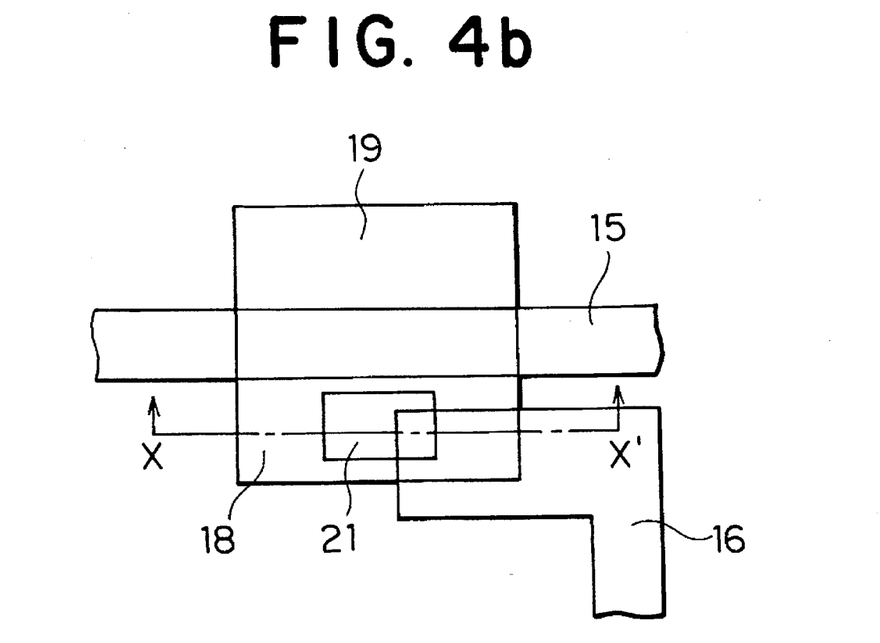

FIGS. 3 and 4 show a semiconductor device and a manufacturing method thereof in accordance with one embodiment of the present invention. FIG. 3e shows an embodiment corresponding to a first construction of the present invention.

An embodiment of the semiconductor device will first be explained with reference to FIGS. 3e and 4b. A diffusion region 18 for a drain and a diffusion region 19 for a source are formed and opposed to each other through a polysilicon gate electrode 15 in an active region, thereby constituting an N-type MOS transistor. A polysilicon electrode 16 connected to a gate electrode of another MOS transistor is wired in the drain region 18. Metallic wiring 25, the drain region 18 and its polysilicon electrode 16 are commonly connected to each other through one contact hole 21.

A method for forming a contact in this embodiment will next be explained with reference to FIGS. 3a to 3e.

(A) As shown in FIG. 3a, a field oxide film 12 having about 4500 Å in thickness is formed by a selective oxidizing method (LOCOS method) in a portion of a P-type silicon substrate 11 except for an active region so as to separate elements from each other.

(B) As shown in FIG. 3b, a thermal oxide film 14 as a gate insulating film is then grown in the active region such that this thermal oxide film 14 has about 150 Å in thickness. Thereafter, a polysilicon film 16 having about 3500 Å in thickness is deposited on the thermal oxide film 14 by a CVD method. A phosphoric glass film is deposited on the polysilicon film 16 and is thermally processed so that the polysilicon film 16 is formed as an N-type and resistance of the polysilicon film 16 is reduced. Thereafter, this phosphoric glass film is removed.

The polysilicon film formed as an N-type is patterned by photolithography and etching. As shown in FIG. 4a as a plan view corresponding to FIG. 3b, a gate electrode 15 for this MOS transistor and the polysilicon electrode 16 are formed such that the polysilicon electrode 16 is connected to a drain region of this MOS transistor and also functions as a gate electrode of another MOS transistor. FIG. 3b is a cross-sectional view taken along line X–X' of FIG. 4a.

Next, arsenic ions 17 are implanted onto an entire face of the substrate, etc. with the gate electrode 15 and the polysilicon electrode 16 as a mask. In this case, implanting energy of each of the arsenic ions is set to about 50 KeV and an implanting amount of the arsenic ions is set to about $6 \times 10^{15}/cm^2$. Thus, high concentration diffusion regions 18 and 19 of the N-type are respectively formed as a drain region and a source region on the substrate.

(C) As shown in FIG. 3c, an interlayer insulating film 20 such as a PSG film having about 7000 Å in thickness is deposited on entire faces of the gate electrode 15 and the polysilicon electrode 16 by the CVD method. Thereafter, a heat treatment for activating the arsenic ions previously implanted is taken.

(D) As shown in FIG. 3d, a contact hole 21 is formed by photolithography and etching on the diffusion region 18 for a drain in a position in which the diffusion region 18 partially overlaps the polysilicon electrode 16. This contact hole 21 is etched until the interlayer insulating film 20 and the thermal oxide film 14 are completely removed by dry etching. Thus, a diffusion region 24 is exposed to a bottom face of the contact hole 21. Further, one portion of a surface of a polysilicon electrode 23 is also exposed into the contact hole 21.

Thereafter, phosphoric ions 22 are implanted through the contact hole 21 with the interlayer insulating film 20 as a mask. Then, a heat treatment for activating the implanted phosphoric ions is taken. Thus, an N-type high concentration region 24 is formed on the bottom face of the contact hole 21 and a surface of the diffusion region 18. Further, an N-type high concentration region 23 is formed on a surface portion of the polysilicon electrode 16 exposed into the contact hole. FIG. 4b is a plan view corresponding to FIG. 3d. FIG. 3d is a cross-sectional view taken alone line X–X' of FiE. 4b.

Figure 5:
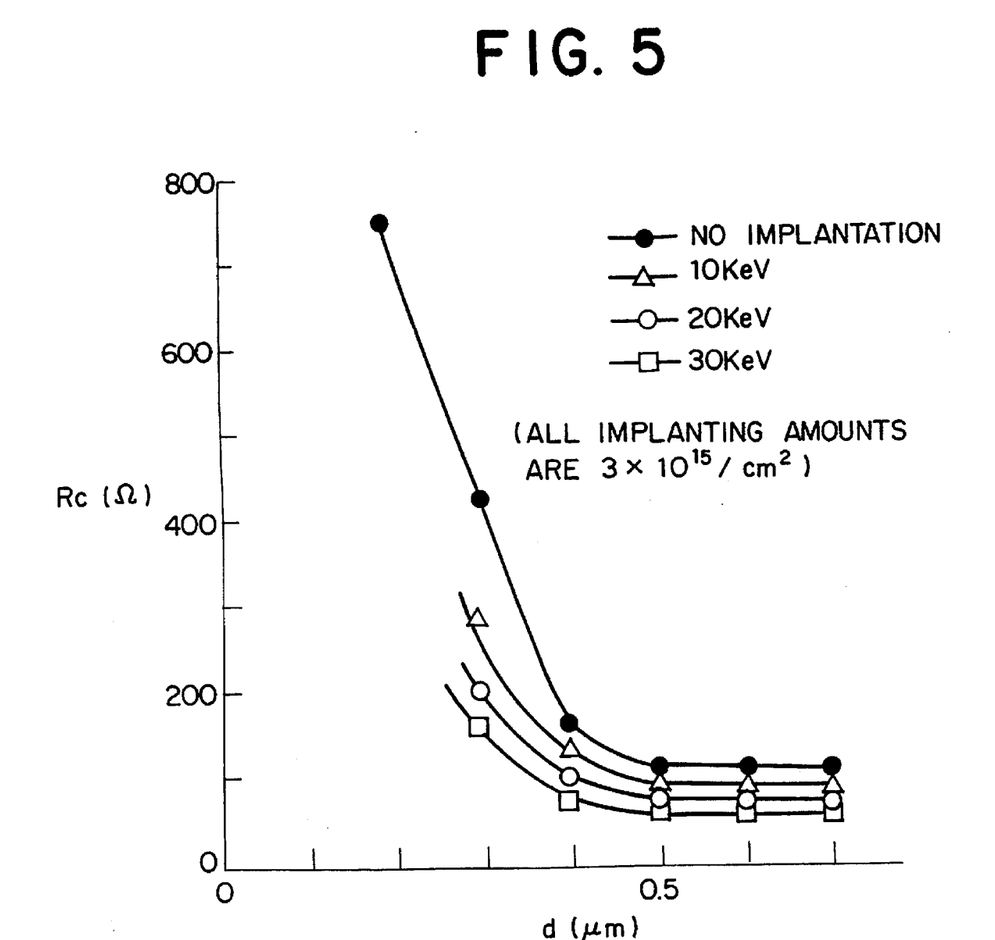
FIG. 5 is a graph showing contact resistance when an implanting condition is changed with implanting energy of an implanted ion as a parameter.
Figure 6:
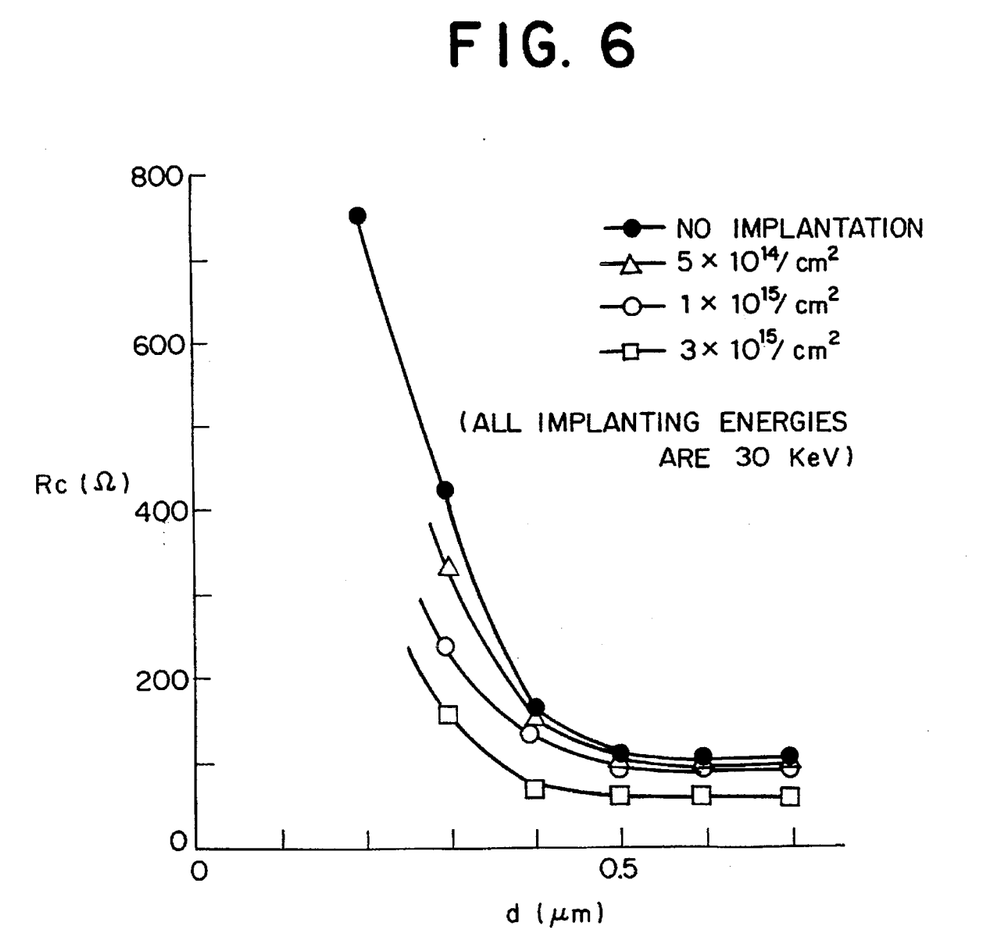
FIG. 6 is a graph showing contact resistance when the implanting condition is changed with an implanting amount of the implanted ion as a parameter.

FIG. 5 is a graph showing data of contact resistance when an implanting condition is changed with implanting energy of each of the implanted ions as a parameter. FIG. 6 is a graph showing data of contact resistance when the implanting condition is changed with an implanting amount of the implanted ions as a parameter. When the contact resistance is sufficiently reduced, it is desirable to set a condition in which the implanting energy is equal to or higher than 30 KeV and the implanting amount is equal to or greater than $3 \times 10^{15}/cm^2$.

(E) As shown in FIG. 3e, an AlSiCu film slightly including silicon and copper is deposited to form metal wiring such that this film has about 7000 Å in thickness. The AlSiCu film is then patterned by photolithography and etching so that metal wiring 25 is formed. The metal wiring 25 is connected to both the diffusion region 18 and the polysilicon electrode 16 through the contact hole 21.

Each of FIGS. 5 and 6 shows contact resistance between the metal wirings 25 and the diffusion region 18. The contact resistance between the metal wiring 25 and the polysilicon electrode 18 is also reduced by existence of the high concentration impurity diffusive layer 23.

Embodiment 2

The embodiment 1 relates to an N-type MOS transistor. Accordingly, conductivity types of the diffusion region of a drain and the polysilicon electrode are the same N-type. The N-type diffusive layers 23 and 24 are formed in a bottom portion of the contact hole by implanting N-type impurities through the contact hole so that the contact resistance is reduced. In contrast to this, the diffusion region of a drain is of a P-type in a P-type MOS transistor or a PMOS transistor portion of a CMOS semiconductor device. Accordingly, when P-type impurity ions are implanted through a contact hole with a gate electrode and a polysilicon electrode as an N-type, the P-type impurities are implanted to the N-type polysilicon electrode within the contact hole so that resistance of the polysilicon electrode is increased. Therefore, there is a fear of an increase in contact resistance between metal wiring and the polysilicon electrode.

Therefore, P-type polysilicon is used in each of the gate electrode and the polysilicon electrode of the P-type MOS transistor in this second embodiment. In the case of the CMOS semiconductor device, the gate electrode and the polysilicon electrode of the N-type MOS transistor are of the N-type, and the gate electrode and the polysilicon electrode of the P-type MOS transistor are of the P-type so that a so-called dual gate structure is formed.

In the manufacturing process shown in FIG. 3b, a polysilicon film is deposited to apply the present invention to the CMOS semiconductor device having the dual gate structure. Thereafter, for example, phosphoric ions as N-type impurities are implanted to the polysilicon film overlapping an active region of the N-type MOS transistor in a condition of about 30 KeV and about $6 \times 10^{15}/cm^2$. Further, for example, boron ions as P-type impurities are implanted to the polysilicon film overlapping an active region of the P-type MOS transistor in a condition of about 30 KeV and $5 \times 10^{15}/cm^2$. Thus, resistance of the polysilicon film is reduced. Similar to the case of the N-type MOS transistor, contact resistance between the metal wiring and the diffusion region can be reduced and contact resistance between the metal wiring and the polysilicon electrode can be also reduced by using this manufacturing process in the case of the P-type MOS transistor.

Embodiment 3

Figure 7A:
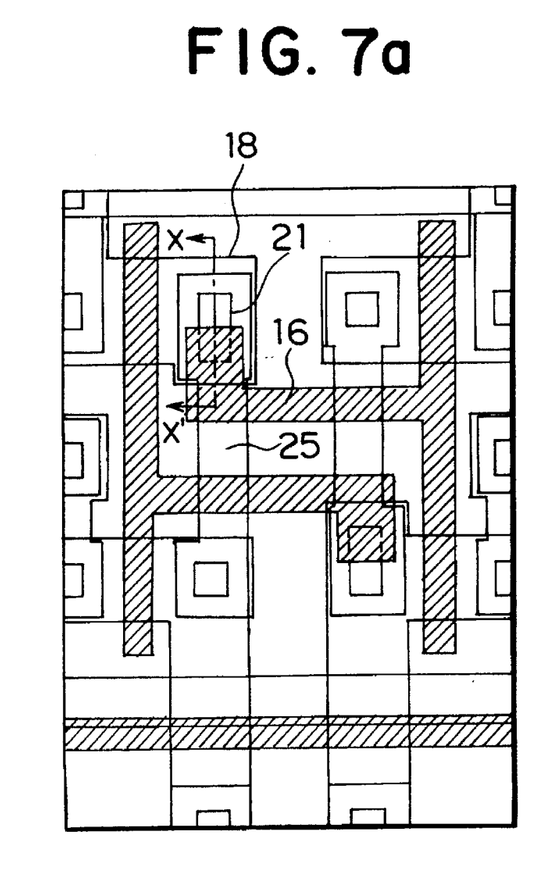
FIG. 7a is a plan view showing a memory cell of a SRAM in accordance with one embodiment of the present invention.
Figure 7B:
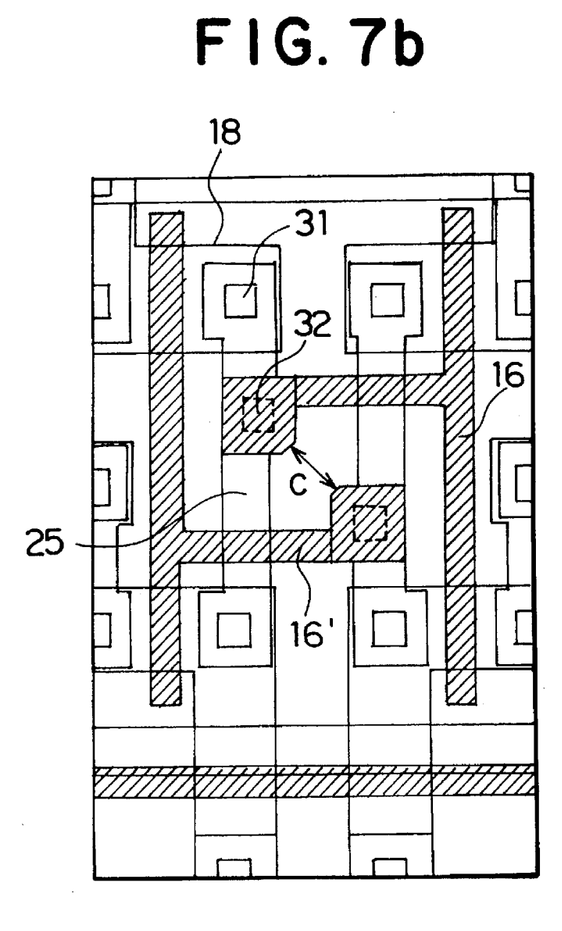
FIG. 7b is a plan view showing a memory cell of a SRAM as a general example.

FIG. 7a shows a case in which the present invention is applied to a memory cell of a SRAM. FIG. 7b shows a general case of the memory cell of a SRAM. In the general example, a diffusion region 18 of a drain and metal wiring 25 are connected to each other through a contact hole 31 so as to sufficiently reduce contact resistance. Further, a polysilicon electrode 16 and the metal wiring 25 are connected to each other through a contact hole 32 so as to sufficiently reduce contact resistance. In such a construction, there is a restriction in which a space C between polysilicon electrodes must be set to be equal to or larger than a constant value. Further, in such a construction, there is a limit in a reduction in size of the memory cell in a longitudinal direction thereof since two contact holes such as the contact holes 31 and 32 are arranged in the longitudinal direction. When the present invention is applied as shown in FIG. 7a, the contact hole 21 can function as the general two contact holes 31 and 32 so that the size of the memory cell can be reduced by about 10% in the longitudinal direction.

A Position of line X–X' in FIG. 7a corresponds to a position of line X–X' in each of FIGS. 4a and 4b.

As mentioned above, in the present invention, a common contact is formed on a diffusion region through a first insulating film as a lower layer and a second insulating film as an upper layer formed on a substrate. A polysilicon electrode is formed between the first and second insulating films and is exposed into a contact hole. Metallic wiring comes in contact with both the polysilicon electrode and the diffusion region through this contact hole. Further, impurities of the same conductivity type as the diffusion region are implanted to an exposure portion of the polysilicon electrode exposed into the contact hole so that resistance of the polysilicon electrode is reduced. Accordingly, the polysilicon electrode, a diffusive layer and the metal wiring can be connected to each other through the contact hole. Further, contact resistance between the metal wiring and the diffusive layer within the contact hole can be reduced and contact resistance between the metal wiring and the polysilicon electrode can be also reduced.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor device in which a semiconductor substrate is of a first conductivity type and a diffusion region of a second conductivity type having an impurity concentration sufficient to form a source or drain region is formed on a surface of the semiconductor substrate and has a contact electrically connected to a polysilicon electrode and metal wiring formed on the semiconductor substrate;

said contact has a contact hole formed on said diffusion region through a first insulating film as a lower layer and a second insulating film as an upper layer formed on the semiconductor substrate;

the polysilicon electrode is formed between the first and second insulting films and is exposed into the contact hole;

the metal wiring comes in contact with both the polysilicon electrode and the diffusion region through the contact hole; and impurities of the same conductivity type as the diffusion region are implanted in exposed portions of the polysilicon electrode and in a portion of the diffusion region exposed in the contact hole so that resistances between the metal wiring and the polysilicon electrode, and between the metal wiring and the diffusion region are reduced.

2. A semiconductor device as claimed in claim 1, wherein the semiconductor device has a memory cell including at least a pair of MOS transistors in which gate and drain electrodes of one MOS transistor are respectively connected to drain and gate electrodes of another MOS transistor; and the diffusion region of said contact is a drain region of each of said MOS transistors and said polysilicon electrode is also used as the gate electrode.

* * * * *